(12) United States Patent
Ohta et al.

(10) Patent No.: US 11,664,198 B2
(45) Date of Patent: May 30, 2023

(54) PLASMA PROCESSING APPARATUS

(71) Applicant: TOKYO ELECTRON LIMITED, Tokyo (JP)

(72) Inventors: Hirofumi Ohta, Miyagi (JP); Hidetoshi Hanaoka, Miyagi (JP); Ayuta Suzuki, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 511 days.

(21) Appl. No.: 16/831,032

(22) Filed: Mar. 26, 2020

(65) Prior Publication Data

US 2020/0312634 A1 Oct. 1, 2020

(30) Foreign Application Priority Data

Mar. 29, 2019 (JP) .............................. JP2019-066585

(51) Int. Cl.
*H01J 37/32* (2006.01)
*H01L 21/68* (2006.01)

(52) U.S. Cl.
CPC .. *H01J 37/32642* (2013.01); *H01J 37/32559* (2013.01); *H01J 37/32715* (2013.01); *H01J 2237/038* (2013.01)

(58) Field of Classification Search
CPC ........... H01J 37/32009; H01J 37/32532; H01J 37/32559; H01J 37/32431; H01J 37/32458; H01J 37/32642; H01J 37/32607; H01J 37/32706; H01J 37/32715; H01J 2237/038; H01J 2237/334; H01L 21/68764; H01L 21/68742; H01L 21/6831; H01L 21/68735
See application file for complete search history.

(56) References Cited

U.S. PATENT DOCUMENTS

| | | | |
|---|---|---|---|
| 11,501,995 B2* | 11/2022 | Uchida | H01L 21/68742 |
| 2007/0215284 A1* | 9/2007 | Oyabu | H01J 37/32009 |
| | | | 118/728 |
| 2010/0000970 A1* | 1/2010 | Koshimizu | H01J 37/32642 |
| | | | 156/345.48 |
| 2010/0012274 A1* | 1/2010 | Miyagawa | H01L 21/67103 |
| | | | 156/345.37 |
| 2010/0300622 A1* | 12/2010 | Yatsuda | H01J 37/32642 |
| | | | 156/345.44 |
| 2015/0168231 A1* | 6/2015 | Koshimizu | G01B 9/02044 |
| | | | 118/712 |
| 2016/0118224 A1* | 4/2016 | Koh | H01J 37/32944 |
| | | | 118/723 R |

FOREIGN PATENT DOCUMENTS

| | | |
|---|---|---|
| JP | 2007-515081 A | 6/2007 |
| JP | 2008-117982 A | 5/2008 |
| JP | 2012-138497 A | 7/2012 |
| WO | 2005/059962 A2 | 6/2005 |

\* cited by examiner

*Primary Examiner* — Haissa Philogene
(74) *Attorney, Agent, or Firm* — Weihrouch IP

(57) ABSTRACT

A plasma processing apparatus includes a conductive mounting table, a conductive member, and a first insulating member. The conductive mounting table has a mounting portion on which a substrate is mounted and a stepped portion positioned lower than the mounting portion. The conductive member is disposed on the stepped portion and extends outward over an outer periphery of the mounting table. Further, a first insulating member is disposed on or above an upper surface of the conductive member.

17 Claims, 7 Drawing Sheets

CR'

CR

PLASMA PROCESSING APPARATUS

CROSS-REFERENCE TO RELATED APPLICATIONS

This application claims priority to Japanese Patent Application No. 2019-066585, filed on Mar. 29, 2019, the entire contents of which are incorporated herein by reference.

TECHNICAL FIELD

The present disclosure relates to a plasma processing apparatus.

BACKGROUND

In manufacturing semiconductor devices, etching or the like is performed on a substrate using plasma of a processing gas. In a plasma processing apparatus used for etching or the like, a substrate is mounted on a mounting table in a chamber and plasma of a processing gas is generated in a space above the mounting table to perform plasma processing on the substrate. A member such as a focus ring or the like is disposed to surround a periphery of the substrate mounted on the mounting table to improve the uniformity of plasma near an edge portion of the substrate. A cover ring is disposed to surround a periphery of the focus ring (see, e.g., Japanese Patent Application Publication No. 2012-138497).

The present disclosure provides a plasma processing apparatus capable of reducing an amount of reaction by-products (hereinafter, also referred to as "deposits") adhered to an outer peripheral portion of a cover ring.

SUMMARY

In accordance with an aspect of the present disclosure, there is provided a plasma processing apparatus including: a conductive mounting table having a mounting portion on which a substrate is mounted and a stepped portion positioned lower than the mounting portion; a conductive member disposed on the stepped portion and extending outward over an outer periphery of the mounting table; and a first insulating member disposed on or above an upper surface of the conductive member.

BRIEF DESCRIPTION OF THE DRAWINGS

The objects and features of the present disclosure will become apparent from the following description of embodiments, given in conjunction with the accompanying drawings, in which.

DETAILED DESCRIPTION

Hereinafter, a plasma processing apparatus according to an embodiment of the present disclosure will be described in detail with reference to the accompanying drawings. The following embodiments are not intended to limit the present disclosure.

Conventionally, a plasma processing apparatus in which an insulating member is disposed at a periphery of a mounting table has been known. In the plasma processing apparatus, deposits may be deposited at an outer peripheral portion of a cover ring that is the insulating member and adhered as particles to a wafer. Here, it is presumed that ions are attracted toward the cover ring due to a potential difference on an inner peripheral portion of the cover ring and, thus, the cover ring and the deposits are etched. On the other hand, it is presumed that the cover ring and the deposits are not etched on the outer peripheral portion of the cover ring because there is no potential difference. Therefore, it is desired to reduce an amount of the deposits adhered to the outer peripheral portion of the cover ring.

Figure 1:
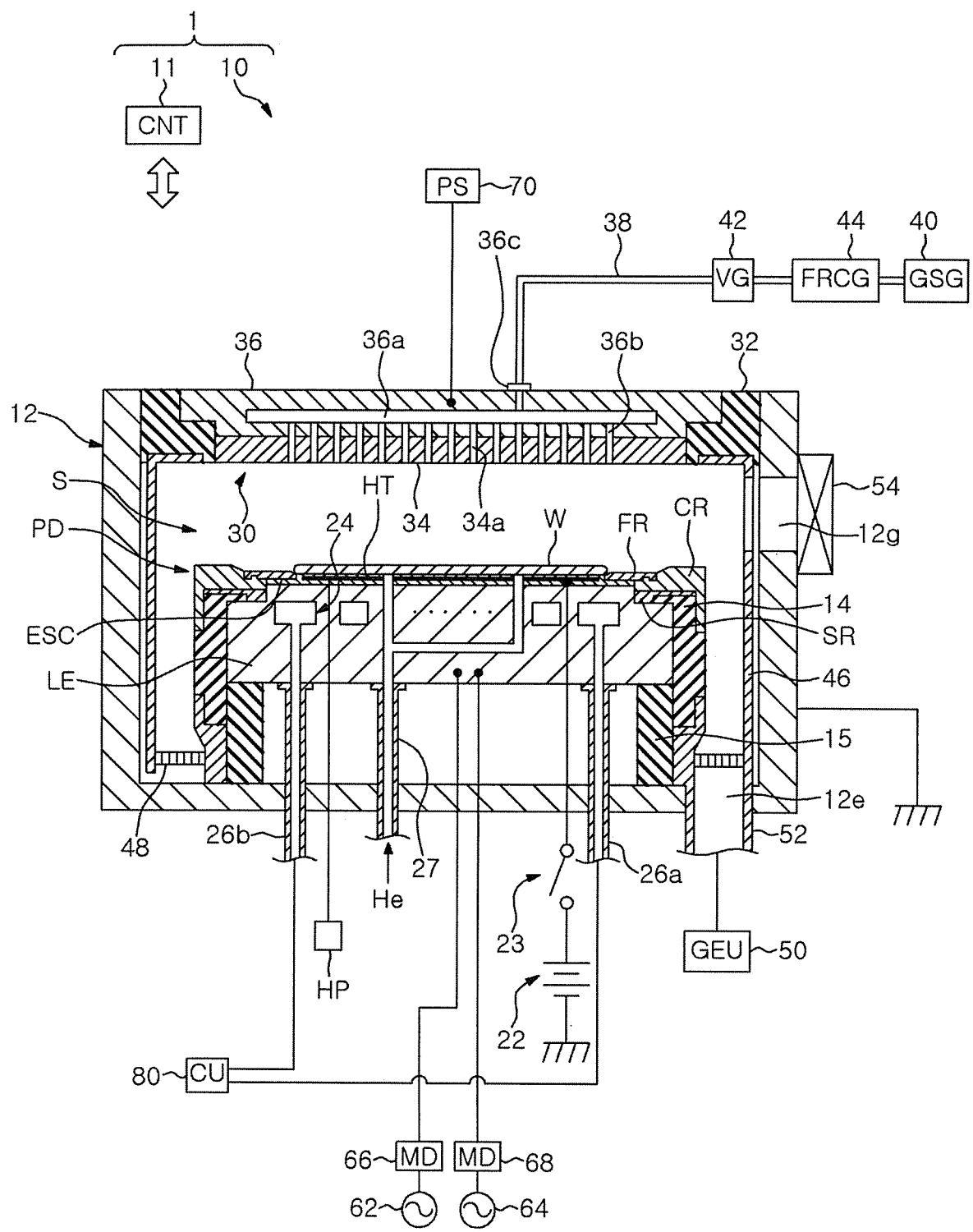
FIG. 1 shows an example of a processing system according to an embodiment of the present disclosure.

(Configuration of the Processing System 1) FIG. 1 shows an example of a processing system 1 according to an embodiment of the present disclosure. The processing system 1 includes a plasma processing apparatus and a controller (CNT) 11. The plasma processing apparatus 10 of the present embodiment is a plasma etching apparatus including parallel plate electrodes. The plasma processing apparatus 10 includes a substantially cylindrical processing chamber 12. The processing chamber 12 is made of, e.g., aluminum or the like and has an anodically oxidized inner wall surface. The processing chamber 12 is frame grounded.

A substantially cylindrical support member 15 made of an insulating material such as quartz is disposed on a bottom portion of the processing chamber 12. The support member 15 extends vertically upward from the bottom portion of the processing chamber 12. A mounting table PD is disposed in the processing chamber 12. The mounting table PD is supported by the support member 15.

The mounting table PD includes a cover ring CR, a focus ring FR, an electrostatic chuck ESC, a lower electrode LE, a silicon ring SR, and a second insulating member 14. The lower electrode LE has a substantially disc shape and is made of a metal such as aluminum, aluminum alloy, titanium, titanium alloy, or stainless steel. The second insulating member 14 is disposed to surround a periphery of the lower electrode LE.

The electrostatic chuck ESC is disposed on the lower electrode LE. A combination of the lower electrode LE and the electrostatic chuck ESC is an example of a mounting unit. The electrostatic chuck ESC has a structure in which an electrode made of a conductive film is embedded between two insulating layers or two insulating sheets. A DC power supply 22 is electrically connected to the electrode of the electrostatic chuck ESC through a switch 23. A substantially circular plate-shaped substrate is attracted to and held on the electrostatic chuck ESC by an electrostatic force such as Coulomb force or the like generated by a DC voltage applied from the DC power supply 22 to the electrostatic chuck ESC through the switch 23. The substrate W is an example of a target object to be processed. Accordingly, the substrate W can be held on the electrostatic chuck ESC.

The focus ring FR is disposed on a peripheral portion of the lower electrode LE to surround an edge of the substrate W and the electrostatic chuck ESC. The focus ring FR is disposed to cover the boundary portion between the electrostatic chuck ESC and the cover ring CR. The focus ring FR is provided to improve the uniformity of processing such as etching on the substrate W. The focus ring FR is made of a material that is appropriately selected depending on the material of a film to be processed and may be made of a conductor such as silicon, silicon carbide (SiC), or the like. The focus ring FR is also referred to as an "edge ring." The peripheral portion of the lower electrode LE has a stepped portion positioned lower than the electrostatic chuck ESC. The silicon ring SR is disposed on the stepped portion of the lower electrode LE. The silicon ring SR may be made of a conductor such as silicon. In addition, a flange of the second insulating member 14 is disposed on the stepped portion of the lower electrode LE. The silicon ring SR is disposed to cover a part of the second insulating member 14.

On the silicon ring SR and the second insulating member 14, the cover ring CR is disposed at an outer peripheral portion of the focus ring FR to surround the focus ring FR. The cover ring CR is made of an insulator such as quartz, alumina, or the like. The cover ring CR is an example of a first insulating member. The cover ring CR protects the upper surfaces of the silicon ring SR and the second insulating member 14 from plasma. Further, an upper portion of the inner peripheral portion of the cover ring CR is covered by the outer peripheral portion of the focus ring FR. Further, the cover ring CR is disposed to cover the silicon ring SR and a side surface of an upper portion of the second insulating member 14.

The second insulating member 14 has the flange on an inner peripheral portion thereof, and the flange is supported while being in contact with the stepped portion of the lower electrode LE. The second insulating member 14 is made of an insulating material such as quartz or the like.

A flow path 24 for circulating a coolant is formed in the lower electrode LE. A coolant is supplied from a chiller unit (CU) 80 disposed outside the processing chamber to the flow path 24 through a line 26a. The coolant supplied to the flow path 24 through the line 26a flows through the flow path 24 and is returned to the chiller unit 80 through a line 26b.

A heater HT as a heating element is disposed in the electrostatic chuck ESC. A heater power supply HP is connected to the heater HT. The electrostatic chuck ESC is heated by supplying a power from the heater power supply HP to the heater HT. The temperature of the substrate W on the electrostatic chuck ESC is controlled to a predetermined temperature by the cooling using the coolant circulating in the flow path 24 of the lower electrode LE and the heating using the heater HT in the electrostatic chuck ESC. The heater HT may be disposed in the lower electrode LE.

The plasma processing apparatus 10 further includes a line 27 for supplying a heat transfer gas such as He gas or the like. The heat transfer gas supplied through the line 27 is supplied to a gap between an upper surface of the electrostatic chuck ESC and a backside of the substrate W. The controller 11 controls thermal conductivity between the electrostatic chuck ESC and the substrate W by controlling the pressure of the heat transfer gas supplied to the gap between the upper surface of the electrostatic chuck ESC and the backside of the substrate W.

The plasma processing apparatus 10 further includes an upper electrode 30. The upper electrode 30 is disposed above the mounting table PD to face the mounting table PD. The lower electrode LE and the upper electrode 30 are arranged substantially in parallel with each other. A processing space S where plasma for performing plasma processing on the substrate W is generated is formed between the upper electrode 30 and the lower electrode LE.

The upper electrode 30 is supported at an upper portion of the processing chamber 12 through a third insulating member 32 such as quartz. The upper electrode 30 includes an electrode plate 34 and an electrode holder 36. The electrode plate 34 is made of, e.g., a silicon-containing material. A bottom surface of the electrode plate 34 faces the processing space S. The electrode plate 34 is provided with a plurality of gas injection holes 34a.

The electrode holder 36 is made of a conductive material such as aluminum or the like and detachably holds the electrode plate 34. The electrode holder 36 may have a water-cooling structure. A gas diffusion space 36a is disposed in the electrode holder 36. A plurality of gas holes 36b respectively communicating with the gas injection holes 34a extend downward from the gas diffusion space 36a. A gas inlet port 36c for guiding a processing gas to the gas diffusion space 36a is formed at the electrode holder 36. A first end of a line 38 is connected to the gas inlet port 36c.

A second end of the line 38 is connected to a gas source group (GSG) 40 through a valve group (VG) 42 and a flow rate controller group (FRCG) 44. A combination of the gas source group 40, the valve group 42, and the flow rate controller group 44 is an example of a gas supply unit. The gas source group 40 includes a plurality of gas sources. The gas sources may include a $H_2$ gas source, a $CH_2F_2$ gas source, a $NF_3$ gas source, a HBr gas source, $C_xF_y$ gas (x and y being natural numbers), and the like. The gas sources may further include a noble gas source such as a He gas source, an Ar gas source, or the like.

The valve group 42 includes a plurality of valves. The flow rate controller group 44 includes a plurality of flow rate controllers such as mass flow controllers. The gas sources of the gas source group 40 are connected to the line 38 through corresponding valves of the valve group 42 and corresponding flow rate controllers of the flow controller group 44. Therefore, the plasma processing apparatus 10 is configured to supply gases from one or more gas sources selected from the plurality of gas sources in the gas source group 40 into the processing chamber 12 at individually controlled flow rates.

In the processing chamber 12, a deposition shield 46 is detachably disposed along an inner wall of the processing chamber 12. The deposition shield 46 is also disposed at a periphery (e.g., a part) of the second insulating member 14 and a periphery of the support member 15. The deposition shield 46 may be formed by coating ceramic such as $Y_2O_3$ or the like on an aluminum base, for example.

At the bottom portion of the processing chamber 12, a gas exhaust plate 48 is disposed between the support member 15 and the inner wall of the processing chamber 12. The gas exhaust plate 48 may be formed by coating ceramic such as $Y_2O_3$ or the like on an aluminum base, for example. A gas exhaust port 12e is disposed below the gas exhaust plate 48 in the processing chamber 12. A gas exhaust unit (GEU) 50 is connected to the gas exhaust port 12e through a gas exhaust line 52. The gas exhaust unit 50 has a vacuum pump such as a turbo-molecular pump or the like and is configured to reduce an internal pressure of the processing chamber 12 to a desired vacuum level. An opening 12g for loading and unloading the substrate W is formed at the sidewall of the processing chamber 12. The opening 12g can be opened and closed by a gate valve 54.

The plasma processing apparatus 10 further includes a first radio frequency power supply 62 and a second radio frequency power supply 64. The first radio frequency power supply 62 generates a first radio frequency power for plasma generation. The first radio frequency power supply 62 generates the radio frequency power having a frequency within a range of 27 MHz to 100 MHz, e.g., 40 MHz. The first radio frequency power supply 62 is connected to the lower electrode LE through a matching device (MD) 66. The matching device 66 is a circuit for matching an output impedance of the first radio frequency power supply 62 and an input impedance of a load (the lower electrode LE) side. The first radio frequency power supply 62 may be connected to the upper electrode 30 through the matching device 66. A combination of the first radio frequency power supply 62 and the lower electrode LE is an example of a plasma generation unit.

The second radio frequency power supply 64 generates a second radio frequency power, i.e., a radio frequency bias power, for attracting ions to the substrate W. The second radio frequency power supply 64 generates the radio frequency bias power having a frequency within a range of 200 kHz to 13.56 MHz, e.g., 400 kHz. The second radio frequency power supply 64 is connected to the lower electrode LE through a matching device (MD) 68. The matching device 68 is a circuit for matching an output impedance of the second radio frequency power supply 64 and the input impedance of the load (the lower electrode LE) side.

The plasma processing apparatus 10 further includes a power supply (PS) 70. The power supply 70 is connected to the upper electrode 30. The power supply 70 applies to the upper electrode 30 a voltage for attracting positive ions in the processing space S toward the electrode plate 34. In one example, the power supply 70 is a DC power supply for generating a negative DC voltage. When the negative DC voltage is applied from the power supply 70 to the upper electrode 30, the positive ions in the processing space S collide with the electrode plate 34. Accordingly, one or both of secondary electrons and silicon atoms are emitted from the electrode plate 34.

The controller 11 includes a processor, a memory, and an input/output interface. The memory stores programs to be executed by the processor and recipes including processing conditions and the like. The processor executes a program read from the memory and controls the respective parts of the plasma processing apparatus 10 through the input/output interface based on the recipe stored in the memory. Specifically, the controller 11 controls the switch 23, the gas exhaust unit 50, the first radio frequency power supply 62, the matching device 66, the second radio frequency power supply 64, the matching device 68, the power supply 70, the chiller unit 80, the heater power supply HP, and the like.

Specifically, the controller 11 controls the respective parts of the plasma processing apparatus 10 to etch the substrate W under the following processing conditions, for example.

Pressure in the processing chamber 12: 3.333 Pa (25 mTorr)
Processing gas: gas containing $H_2$, $CH_2F_2$, $NF_3$, HBr, $C_xF_y$, or the like
Temperature of substrate W: 60° C.
First radio frequency power (40 MHz): 4.5 kW
Second radio frequency power (400 kHz): 7 kW (Specific Configuration of the Mounting Table PD)

Figure 2:
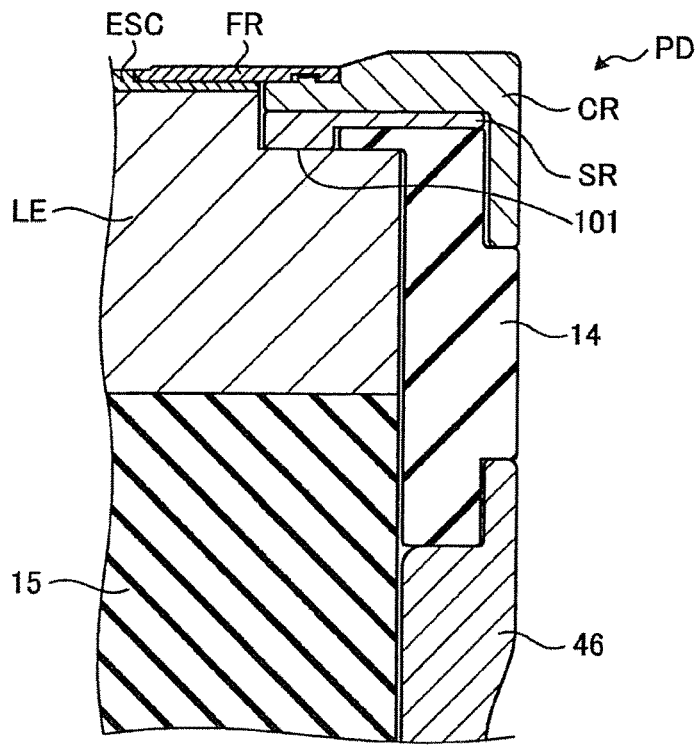
FIG. 2 is a partially enlarged view showing an example of a structure of a mounting table in the embodiment.

FIG. 2 is a partially enlarged view showing an example of a structure of the mounting table PD according to the present embodiment. A plasma-resistant protective film made of a dielectric material, e.g., $Y_2O_3$ or the like, is formed on a stepped portion 101 provided at a peripheral portion of the lower electrode LE. The silicon ring SR on the stepped portion 101 is electrically coupled to the first radio frequency power supply 62 and the second radio frequency power supply 64 through the protective film and the lower electrode LE. The outer peripheral portion of the silicon ring SR extends outward over the outer periphery of the lower electrode LE and covers a part of the second insulating member 14.

The second insulating member 14 is disposed to surround the support member 15 and the lower electrode LE. An upper surface of the second insulating member 14 is in contact with the silicon ring SR. Further, a bottom surface of the second insulating member 14 is in contact with the deposition shield 46. The flange formed at the upper inner peripheral portion of the second insulating member 14 is in contact with the stepped portion 101.

The cover ring CR is disposed on an upper surface of the silicon ring SR. The side surface of the outer peripheral portion of the cover ring CR extends downward to cover the silicon ring SR and the side surface of the upper portion of the second insulating member 14. The focus ring FR and the silicon ring SR are overlapped with each other when viewed in a thickness direction at a portion where the upper portion of the inner peripheral portion of the cover ring CR is covered by the outer peripheral portion of the focus ring FR. In this case, the impedances on the inner peripheral portion and the outer peripheral portion of the focus ring FR can be controlled by changing the thickness of the silicon ring SR or the above-described overlapping state. In other words, the impedances on the inner peripheral portion and the outer peripheral portion of the focus ring FR can be changed secondarily. Accordingly, the deformation of the focus ring FR during the etching can be controlled.

A thickness of the outer peripheral portion of the cover ring CR, which is positioned above the silicon ring SR, can be determined while using the frequency of the radio frequency bias power and the dielectric constant of the cover ring CR as factors. For example, when the cover ring CR is made of quartz and the radio frequency bias power is 3 MHz, it is preferable to set the thickness of the outer peripheral portion of the cover ring CR to 25 mm or less. When the cover ring CR is made of quartz and the radio frequency bias power is 400 kHz, it is preferable to set the thickness of the outer peripheral portion of the cover ring CR to 10 mm or less. When the cover ring CR is made of alumina having a dielectric constant higher than that of quartz, the thickness of the outer peripheral portion of the cover ring CR can be further reduced.

In the present embodiment, since the silicon ring SR extends outward over the outer periphery of the lower electrode LE, the potential difference is generated on the outer peripheral portion of the cover ring CR, which leads to the etching of the outer peripheral portion of the cover ring CR. Therefore, the amount of deposits adhered to the outer peripheral portion of the cover ring CR can be reduced.

Comparative Example 1

Figure 3:
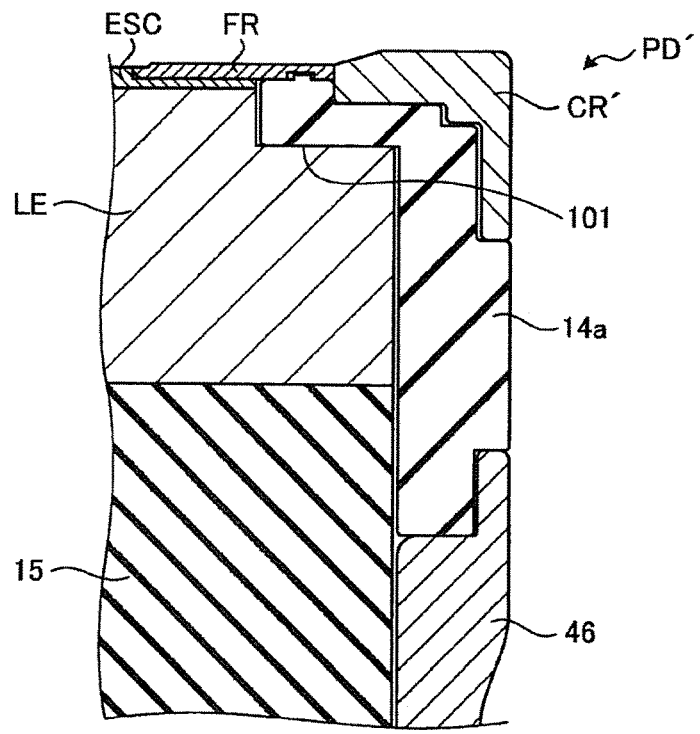
FIG. 3 is a partially enlarged view showing an example of a structure of a mounting table in a comparative example 1.

Hereinafter, a mounting table PD' in a comparative example 1 will be described. FIG. 3 is a partially enlarged view showing an example of a structure of the mounting table PD' according to the comparative example 1. The mounting table PD' shown in FIG. 3 is different from the mounting table PD of the present embodiment shown in FIG. 2 in that a cover ring CR' and a second insulating member 14a are used instead of the cover ring CR and the second insulating member 14 and the silicon ring SR is not provided. The focus ring FR, the electrostatic chuck ESC, the lower electrode LE, the support member 15, and the deposition shield 46 are the same as those of the mounting table PD.

In the second insulating member 14a of the comparative example 1, a flange of the second insulating member 14a is disposed over the entire stepped portion 101 of the lower electrode LE. Therefore, the conductive member is not provided at a position over the outer periphery of the lower electrode LE, and there is no potential difference on the outer peripheral portion of the cover ring CR'. Accordingly, deposits may be deposited on the outer peripheral portion of the cover ring CR'.

Figure 4:
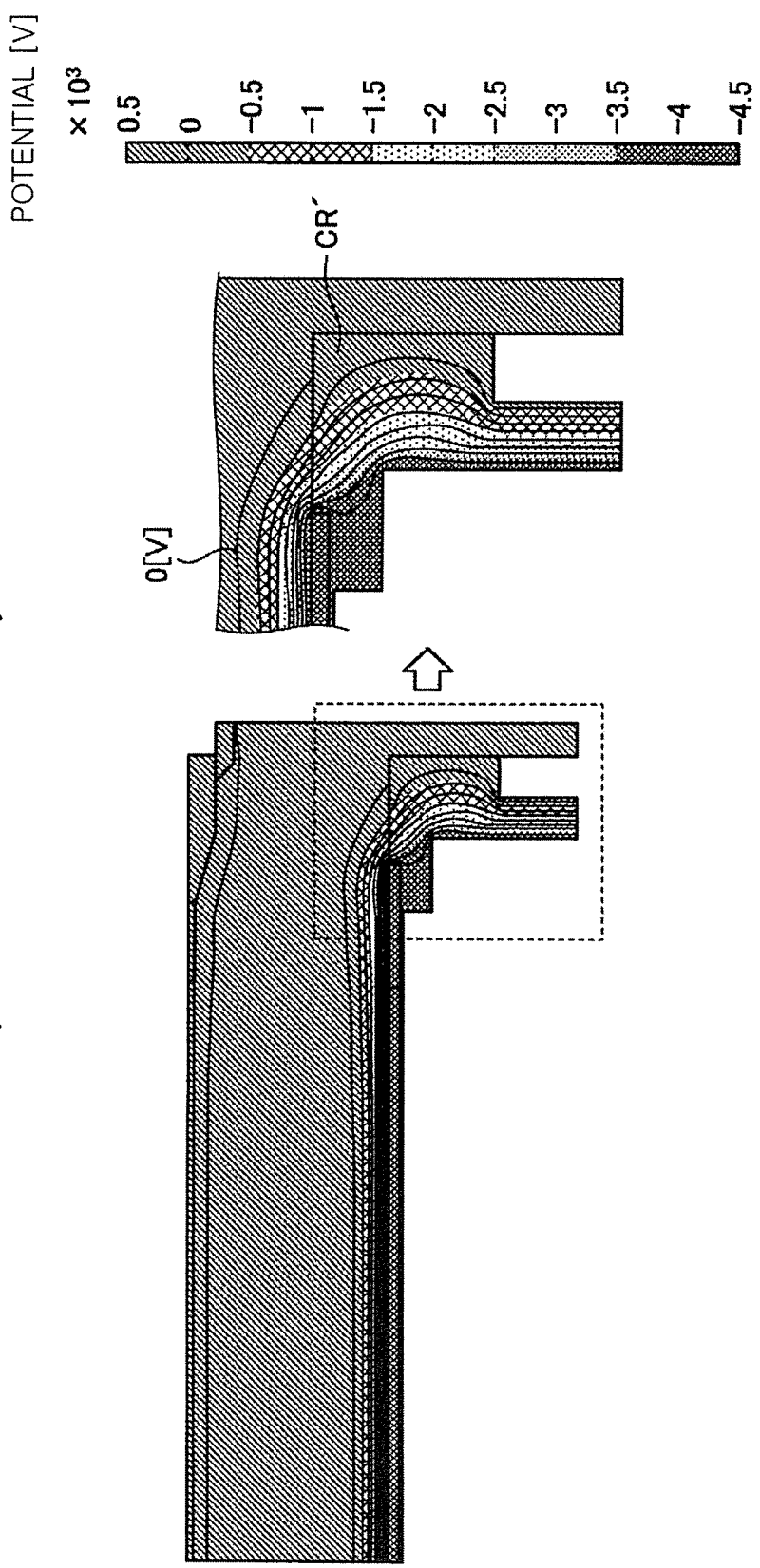
FIG. 4 shows an example of a simulation result of an electric field intensity in the comparative example 1.

Hereinafter, the electric field intensity in the mounting table PD' and the mounting table PD will be described with reference to FIGS. 4 and 5. FIG. 4 shows an example of a simulation result of the electric field intensity in the comparative example 1. As shown in FIG. 4, in the mounting table PD' of the comparative example 1, a line indicating the potential 0[V] substantially coincides with the surface of the cover ring CR' on the outer peripheral portion of the cover ring CR'. In other words, there is no potential difference on the outer peripheral portion of the cover ring CR', so that ions are not attracted toward the cover ring CR'.

Figure 5:
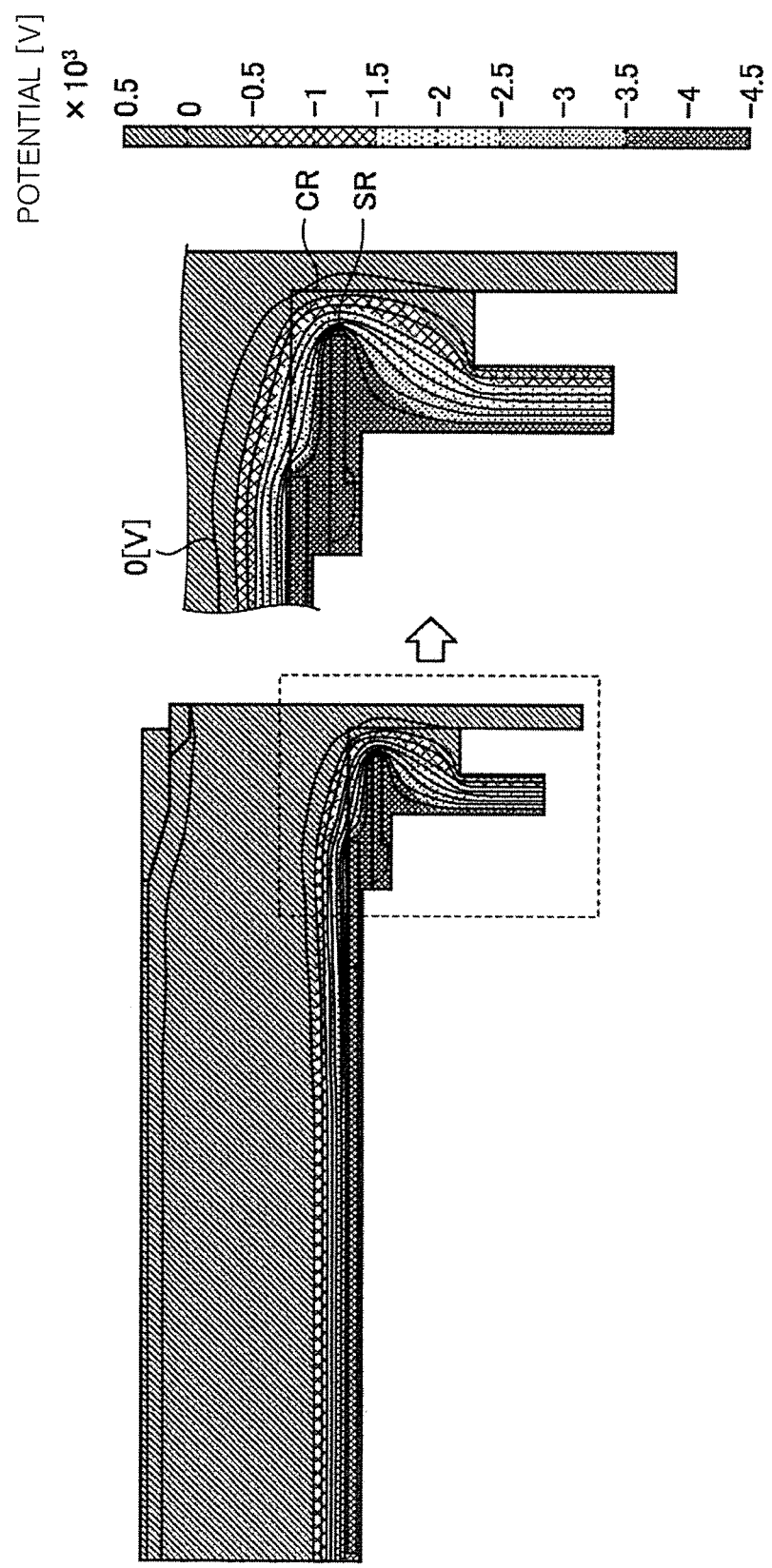
FIG. 5 shows an example of a simulation result of an electric field intensity in the embodiment.

FIG. 5 shows an example of a simulation result of the electric field intensity in the present embodiment. As shown in FIG. 5, in the mounting table PD of the present embodiment, the electric field expands toward the outer side of the mounting table PD due to the presence of the silicon ring SR, so that the line indicating the potential 0[V] passes near an edge of the outer peripheral portion of the cover ring CR. In other words, the potential difference is generated on the outer peripheral portion of the cover ring CR and, thus, ions are attracted toward the cover ring CR.

(Test Result)

Figure 6:
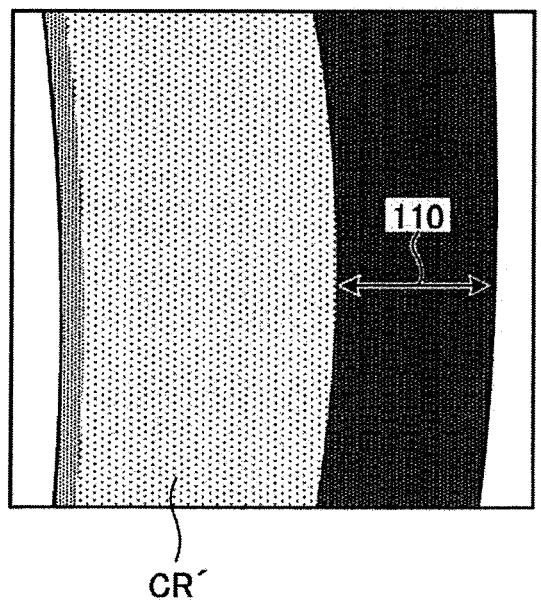
FIG. 6 shows an example of an appearance of a cover ring in the comparative example 1.
Figure 7:
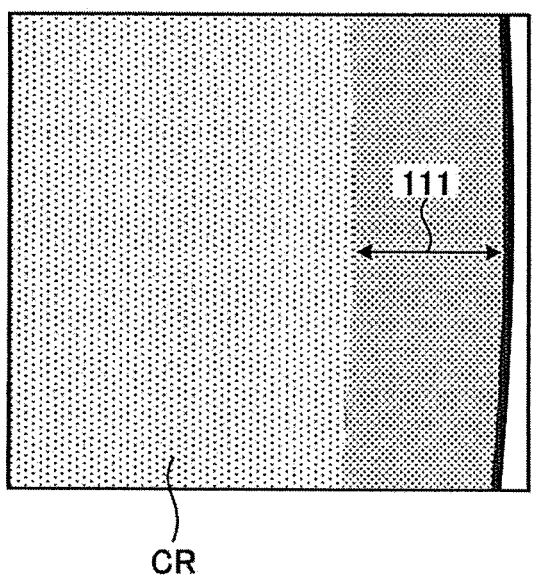
FIG. 7 shows an example of an appearance of a cover ring in the embodiment.

A test on the deposits and the consumption amount of the cover ring after the plasma processing is completed was conducted using the mounting table PD' of the comparative example 1 and the mounting table PD of the present embodiment. FIG. 6 shows an example of an appearance of the cover ring in the comparative example 1. FIG. 7 shows an example of an appearance of the cover ring in the present embodiment. As shown in FIG. 6, in the cover ring CR' of the comparative example 1, a large amount of deposits were adhered to an outer peripheral region 110. At this time, the number of particles on the substrate W was 133 when the plasma processing was performed for 250 hours. On the other hand, in the cover ring CR of the present embodiment, deposits were hardly adhered to an outer peripheral region 111. At this time, the number of particles on the substrate W was 22 when the plasma processing was performed for 300 hours.

Figure 8:
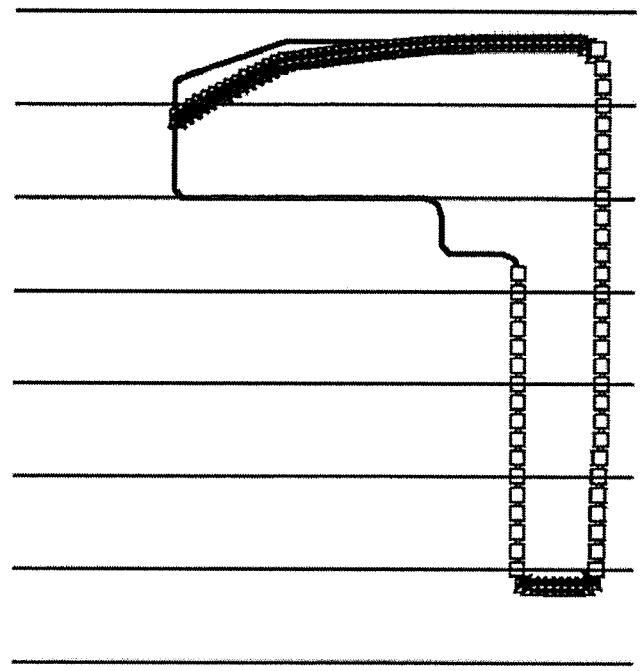
FIG. 8 shows an example of a consumption amount of the cover ring in the comparative example 1.
Figure 9:
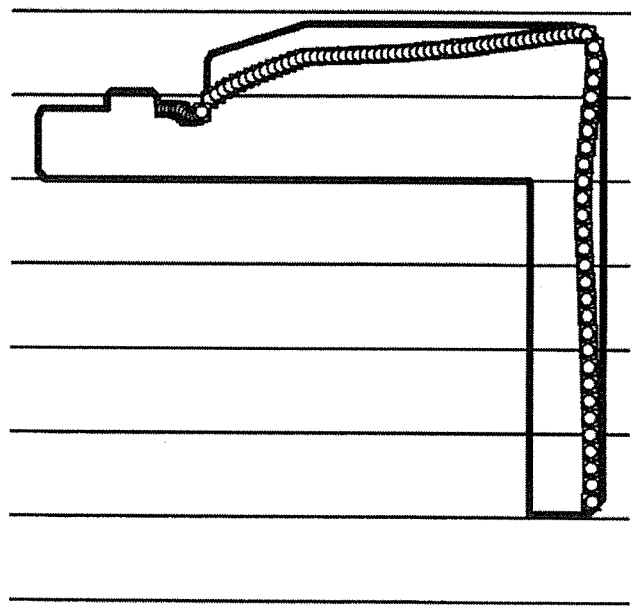
FIG. 9 shows an example of a consumption amount of the cover ring in the embodiment.

FIG. 8 shows an example of the consumption amount of the cover ring CR' in the comparative example 1. FIG. 9 shows an example of the consumption amount of the cover ring CR in the present embodiment. As shown in FIG. 8, in the cover ring CR' of the comparative example 1, the outer peripheral portion of the cover ring CR' was not consumed. On the other hand, in the cover ring CR of the present embodiment, the outer peripheral portion of the cover ring CR was also consumed. In other words, in the present embodiment, ions were attracted toward the outer peripheral portion of the cover ring CR and, thus, the cover ring and the deposits were etched.

(Modification)

Figure 10:
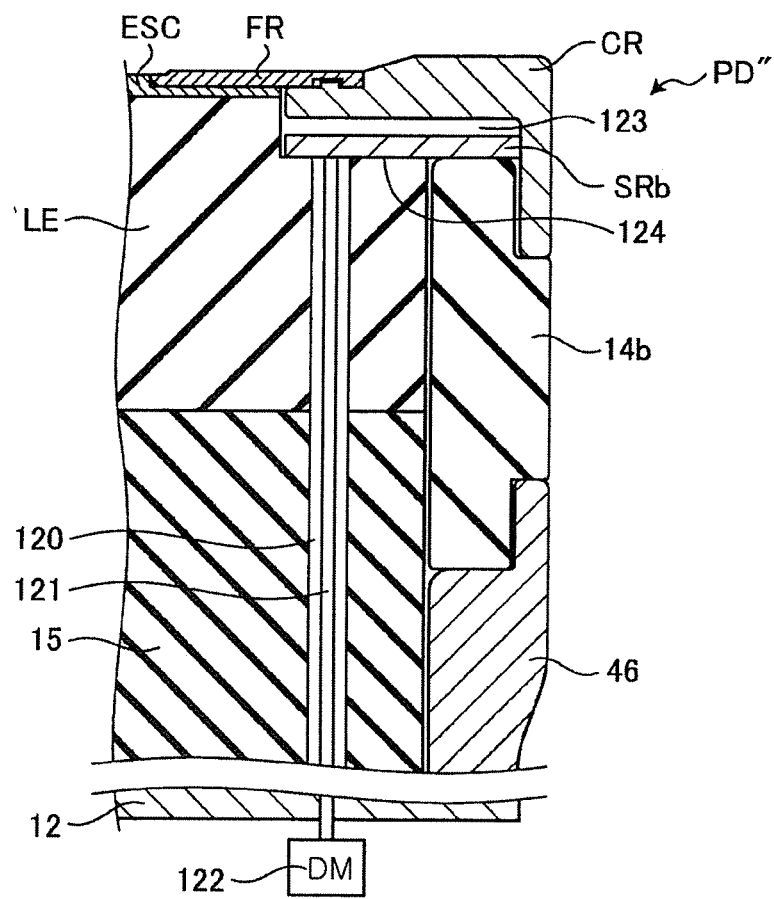
FIG. 10 is a partially enlarged view showing an example of a structure of a mounting table in a modification.

The plasma processing may be performed under processing conditions in which the deposits are not adhered to the outer peripheral portion of the cover ring CR. In this case, the consumption of the cover ring CR can be prevented by setting the distribution of the electric field intensity to be the same as that in the case of the mounting table PD' shown in FIG. 4. FIG. 10 is a partially enlarged view showing an example of a structure of a modified mounting table PD". The modified mounting table PD" shown in FIG. 10 is different from the mounting table PD of the present embodiment shown in FIG. 2 in that a space 123 is provided above a silicon ring SRb so that the silicon ring SRb can be vertically moved. The focus ring FR, the electrostatic chuck ESC, the deposit shield 46 and the cover ring CR of the mounting table PD" are the same as those of the mounting table PD.

The silicon ring SRb of the modified example is in contact with a driving pin 121 penetrating through a hole 120 formed in the support member 15 and the lower electrode LE. The driving pin 121 can be vertically moved by a driving mechanism (DM) 122 disposed at the bottom portion of the processing chamber 12. The driving mechanism may be an actuator, a motor, and/or other device that controllably urges the driving pin 121 upward and downward in the hole 120. The driving pin 121 is made of an insulator such as quartz, alumina, or the like. The driving pin 121 and the driving mechanism 122 are disposed at a plurality of, e.g. four positions on the circumference of the silicon ring SRb so that the silicon ring SRb can be evenly lifted.

In the mounting table PD" of the modified example, an upper end of a second insulating member 14b is positioned at the same height as that of a stepped portion 124 of the lower electrode LE and the space 123 where the silicon ring SRb can be vertically moved is provided. A lower end of the second insulating member 14b is in contact with the deposition shield 46, similar to the second insulating member 14 of the present embodiment.

When the driving pins 121 are lowered, the silicon ring SRb comes in contact with the stepped portion 124 of the lower electrode LE, and the silicon ring SRb is electrically coupled to the first radio frequency power supply 62 and the second radio frequency power supply 64 through the lower electrode LE. In this case, similar to the mounting table PD of the present embodiment shown in FIG. 2, it is possible to suppress the adhesion of deposits to the outer peripheral portion of the cover ring CR.

When the driving pins 121 are raised by operating the driving mechanism 122, the silicon ring SRb is moved to a position where the upper surface of the silicon ring SRb becomes in contact with the cover ring CR and, thus, the silicon ring SRb floats from the stepped portion 124. In other words, a space of, e.g., 1 mm to 2 mm is present between the silicon ring SRb and the stepped portion 124. Then, the silicon ring SRb is electrically decoupled to the lower electrode LE. In this case, similar to the mounting table PD' of the comparative example 1 shown in FIG. 3, there is no potential difference on the outer peripheral portion of the cover ring CR and, thus, the consumption of the cover ring CR can be prevented.

As described above, in accordance with the present embodiment, the plasma processing apparatus 10 includes the mounting table PD, the conductive member (the silicon ring SR), and the first insulating member (the cover ring CR). The mounting table PD is the conductive mounting table having a mounting portion on which the substrate is mounted and the stepped portion 101 positioned lower than the mounting portion. The conductive member is disposed on the stepped portion 101 and extends outward over the outer periphery of the mounting table PD. The first insulating member is disposed on or above the upper surface of the conductive member. Accordingly, the amount of reaction by-products (deposits) adhered to the outer peripheral portion of the first insulating member (the cover ring CR) can be reduced.

In accordance with the present embodiment, the first insulating member is disposed to cover the conductive member. Accordingly, the outer peripheral portion of the first insulating member can also be etched.

In accordance with the present embodiment, the plasma processing apparatus 10 further includes the second insulating member 14 that covers the side surface of the mounting table PD. Accordingly, the conductive member can be prevented from being exposed to plasma.

In accordance with the present embodiment, the dielectric protective film is formed on the stepped portion 101.

In accordance with the present embodiment, the plasma processing apparatus 10 further includes the conductive focus ring FR that is disposed on the first insulating member. Accordingly, the impedances on the inner peripheral portion and the outer peripheral portion of the focus ring FR can be controlled.

In accordance with the modified embodiment, the mounting table PD" is provided with the space between the conductive member (the silicon ring SRb) and the first insulating member (the cover ring CR). In the space, the conductive member can be vertically moved. The plasma processing apparatus 10 further includes the driving mechanism 122 for vertically driving the conductive member. Accordingly, the etching amount on the outer peripheral portion of the first insulating member can be controlled.

The presently disclosed embodiments are considered in all respects to be illustrative and not restrictive. The above-described embodiments can be embodied in various forms. Further, the above-described embodiments may be omitted, replaced, or changed in various forms without departing from the scope of the appended claims and the gist thereof.

In the above-described embodiments, the plasma processing apparatus 10 for performing etching or the like on the substrate W using capacitively-coupled plasma as a plasma source has been described as an example. However, the present disclosure is not limited thereto. As long as an apparatus performs processing on the substrate W using plasma, the plasma source is not limited to the capacitively-coupled plasma. For example, the plasma source may be any plasma source such as inductively-coupled plasma, microwave plasma, magnetron plasma, or the like.

In the processing system 1 of the above-described embodiments, the plasma processing is performed on the substrate W maintained at a temperature of 0° C. or lower. However, the present disclosure is not limited thereto and may be applied to the processing system 1 for performing plasma processing on the substrate W maintained at a temperature of 0° C. or higher.

While certain embodiments have been described, these embodiments have been presented by way of example only and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

The invention claimed is:

1. A plasma processing apparatus comprising:
a conductive mounting table having a mounting portion on which a substrate is mounted and a stepped portion positioned lower than the mounting portion;
a conductive member disposed on the stepped portion and extending outward over an outer periphery of the mounting table; and
a first insulating member disposed above an upper surface of the conductive member,
wherein a space where the conductive member is vertically movable is provided between the conductive member and the first insulating member, and
the plasma processing apparatus further comprises:
a driving mechanism configured to vertically move the conductive member.

2. The plasma processing apparatus of claim 1, wherein the first insulating member is disposed to cover the conductive member.

3. The plasma processing apparatus of claim 1, further comprising:
a second insulating member that covers a side surface of the mounting table.

4. The plasma processing apparatus of claim 2, further comprising:
a second insulating member that covers a side surface of the mounting table.

5. The plasma processing apparatus of claim 1, wherein a dielectric protective film is formed on the stepped portion.

6. The plasma processing apparatus of claim 2, wherein a dielectric protective film is formed on the stepped portion.

7. The plasma processing apparatus of claim 3, wherein a dielectric protective film is formed on the stepped portion.

8. The plasma processing apparatus of claim 1, further comprising:
a conductive focus ring that is disposed on the first insulating member.

9. The plasma processing apparatus of claim 2, further comprising:
a conductive focus ring that is disposed on the first insulating member.

10. The plasma processing apparatus of claim 3, further comprising:
a conductive focus ring that is disposed on the first insulating member.

11. The plasma processing apparatus of claim 5, further comprising:
a conductive focus ring that is disposed on the first insulating member.

12. The plasma processing apparatus of claim 11, further comprising:
a plurality of driving pins for vertically moving the conductive member.

13. The plasma processing apparatus of claim 3, wherein an upper end of the second insulating member is positioned at the same height as that of the stepped portion.

14. The plasma processing apparatus of claim 11, further comprising:
a second insulating member that covers a side surface of the mounting table,
wherein an upper end of the second insulating member is positioned at the same height as that of the stepped portion.

15. The plasma processing apparatus of claim 1, further comprising:
a plurality of driving pins for vertically moving the conductive member.

16. The plasma processing apparatus of claim 12, wherein a space of 1 mm to 2 mm is provided between the conductive member and the stepped portion when the driving pins are raised.

17. The plasma processing apparatus of claim 15, wherein a space of 1 mm to 2 mm is provided between the conductive member and the stepped portion when the driving pins are raised.

\* \* \* \* \*

UNITED STATES PATENT AND TRADEMARK OFFICE
CERTIFICATE OF CORRECTION

| | | |
|---|---|---|
| PATENT NO. | : 11,664,198 B2 | Page 1 of 1 |
| APPLICATION NO. | : 16/831032 | |
| DATED | : May 30, 2023 | |
| INVENTOR(S) | : Hirofumi Ohta et al. | |

It is certified that error appears in the above-identified patent and that said Letters Patent is hereby corrected as shown below:

On the Title Page

Item (56) References Cited (U.S. Patent Documents):
"US 2016/0118224 A1 4/2016 Koh"
Should read as:
--US 2016/0118224 A1 4/2016 Kohno.--.

Signed and Sealed this
Eleventh Day of July, 2023

Katherine Kelly Vidal
*Director of the United States Patent and Trademark Office*